United States Patent [19]

Simpson

[11] 4,128,697

[45] Dec. 5, 1978

[54] HERMETIC GLASS-METAL COMPRESSION SEAL

[75] Inventor: William M. Simpson, Corning, N.Y.

[73] Assignee: Corning Glass Works, Corning, N.Y.

[21] Appl. No.: 789,963

[22] Filed: Apr. 22, 1977

[51] Int. Cl.$^2$ .................................................. B32B 17/06
[52] U.S. Cl. ............................................ 428/433; 65/59 R; 106/52; 106/54; 174/50.61; 403/30; 428/432; 428/457; 428/538
[58] Field of Search .............. 428/433, 538, 432, 457; 106/53, 52, 54; 65/59 R; 174/50.61, 50.58; 313/335; 403/30; 75/82

[56] References Cited

U.S. PATENT DOCUMENTS

| | | | |
|---|---|---|---|
| 2,062,335 | 12/1936 | Scott | 75/82 |
| 2,338,538 | 1/1944 | Pulfrich et al. | 403/30 |
| 2,770,923 | 11/1956 | Dalton et al. | 403/30 |
| 3,035,372 | 5/1962 | Mayers | 65/59 A |
| 3,250,631 | 5/1966 | Lusher | 106/52 |
| 3,252,812 | 5/1966 | de Lajarte | 106/52 |
| 3,540,893 | 11/1970 | Petticrew | 106/52 |
| 3,638,076 | 1/1972 | Koons | 174/50.61 |
| 3,698,921 | 10/1972 | La Grouw | 106/52 |
| 3,726,987 | 4/1973 | Pryor et al. | 174/50.61 |

Primary Examiner—George F. Lesmes
Assistant Examiner—Edith R. Buffalow
Attorney, Agent, or Firm—Kees van der Sterre; Clinton S. Janes, Jr.; Clarence R. Patty, Jr.

[57] ABSTRACT

Hermetically sealed lead-in structures of the compression seal type, useful for electronic devices and particularly for transistor and integrated circuit headers, are described. The seal structures comprise a glass-metal compression seal between steel casing and low-expansion cobalt-nickel-iron alloy leads, utilizing specific glassy sealing materials which impart thermal shock resistance of at least 425° C. to the compression seal.

3 Claims, 1 Drawing Figure

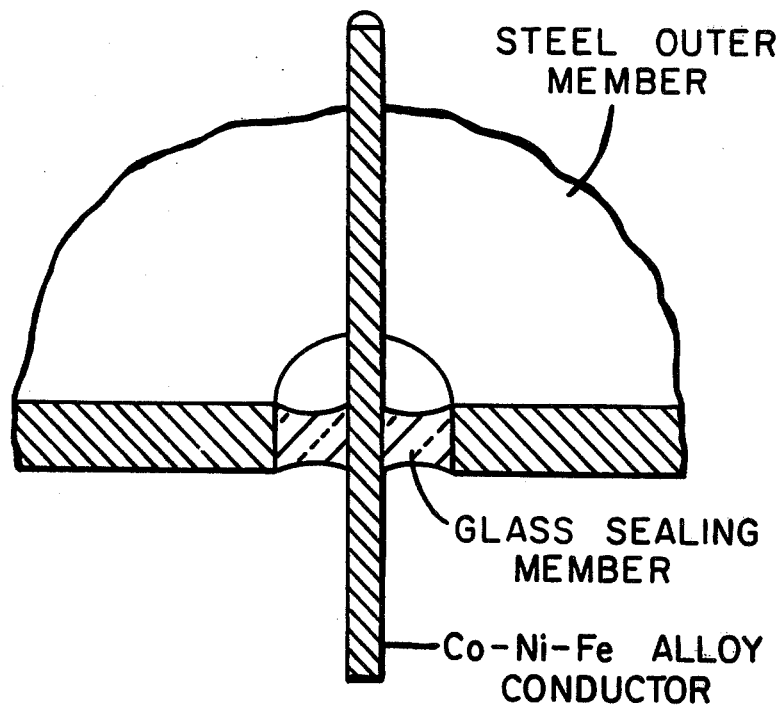

HERMETIC GLASS-METAL COMPRESSION SEAL

BACKGROUND OF THE INVENTION

Hermetically sealed lead-in structures for electronic devices comprising metal casing members are of two basic types. In the first type, referred to as a matched seal, both the outer metallic casing member and the metal lead passing through a hole in the casing are composed of metals having similar coefficients of thermal expansion. The annular opening between the outer metal member and the lead-in conductor is filled with a glass having a coefficient of thermal expansion similar to that of the metal members, such that the hermetic seal formed by the case, glass and metal lead is essentially strain-free. A typical prior-art matched seal includes metal case and lead members composed of a low expansion cobalt-nickel-iron alloy, such as KOVAR ® alloy, and a glass seal composed of a borosilicate glass of similar thermal expansion characteristics. U.S. Pat. No. 2,062,335 to Scott describes glass and metal sealing materials of the kind often used for matched seals of this type.

A second type of lead-in seal structure is commonly referred to as a compression seal, because seal integrity is imparted by compressive stresses in the seal arising during sealing. U.S. Pat. No. 2,770,923 to Dalton et al. shows a typical compression seal structure, which includes an outer metal casing member composed of relatively high expansion metal, a lead-in conductor of relatively low expansion metal passing through a hole in the outer casing member, and a glass seal of relatively low or intermediate expansion filling the annular opening between the casing and metal lead.

U.S. Pat. No. 3,035,372 to Mayers describes a hermetically sealed lead-in structure of the glass-metal compression type wherein the outer member is composed of steel and the metallic conductor passing through the opening in the steel outer member is composed of nickel-iron alloy. Compression seals incorporating such materials are presently used in the semiconductor industry to provide headers for transistors, integrated circuits and the like. For this application, steel such as SAE 1010 steel, having an average linear coefficient of thermal expansion of about $125 \times 10^{-7}/°$ C., is used to form the casing constituting the outer member of the seal, while No. 52 alloy, a nickel-iron alloy containing about 51% nickel and having an average linear coefficient of thermal expansion (over the temperature range 30°–450° C.) of about $96–101 \times 10^{-7}/°$ C., is used for the metallic conductor. One glass used for forming the seal member between the steel case and the alloy conductor consists of about 66 parts $SiO_2$, 12 parts BaO, 2.7 parts $Al_2O_3$, 2.0 parts $B_2O_3$, 6.7 parts $Na_2O$, 6.6 parts $K_2O$, 2.0 parts $ZrO_2$, 0.7 parts $Li_2O$ and 1.6 parts F by weight, and has an average linear coefficient of thermal expansion (0°–300° C.) of about $89 \times 10^{-7}/°$ C.

Compression seals formed from the above materials exhibit good thermal shock resistance, e.g., thermal shock resistance to at least about 425° C., which means that they may be heated from room temperature to 425° C. in a matter of seconds and subsequently cooled to room temperature without mechanical failure or loss of hermetic seal. Adequate thermal shock resistance is a property required by manufacturers of solid state electronic devices incorporating these seals.

It has recently been proposed for reasons of cost to substitute low-expansion cobalt-nickel-iron alloy conductors for nickel-iron alloy conductors in compression-sealed lead-in structures such as above described. Such conductors, which may be composed, for example, of KOVAR ® alloy, typically have average linear coefficients of thermal expansion (30°–400° C.) in the range of about $46–52 \times 10^{-7}/°$ C. It was found, however, that the resulting glass-metal compression seals between steel and low-expansion cobalt-nickel-iron alloy did not exhibit thermal shock resistance to 425° C. as did the previous seals.

It is a principal object of the present invention to provide a glass-metal compression seal structure comprising a steel outer member and a low-expansion cobalt-nickel-iron lead-in conductor which withstands thermal shock to at least 425° C. without loss of hermetic properties.

Other objects and advantages of the invention will become apparent from the following description thereof.

SUMMARY OF THE INVENTION

The present invention comprises an improvement in a glass-metal compression seal of the kind described, consisting of a steel outer member having an opening therethrough, a unitary glassy sealing member positioned in the opening and hermetically sealed to the steel, and a low-expansion cobalt-nickel-iron alloy metallic conductor passing through the glassy sealing member and hermetically sealed thereto. The steel outer member is composed of steel having an average linear coefficient of thermal expansion (30°–300° C.) of about $120–130 \times 10^{-7}/°$ C., and the low-expansion cobalt-nickel-iron alloy has an average linear coefficient of thermal expansion (30°–400° C.) of about $46–52 \times 10^{-7}/°$ C.

In accordance with the invention, improved thermal shock resistance is exhibited by the seal when the glassy sealing member is composed of one of two specific sealing materials. The first such material is a glass having an average linear coefficient of thermal expansion (0°–300° C.) of about $88.5 \times 10^{-7}/°$ C. and a composition consisting essentially, in parts by weight, of about 63 parts $SiO_2$, 2.6 parts $Al_2O_3$, 14 parts SrO, 5.8 parts $Na_2O$, 8.9 parts $K_2O$, and 3.0 parts $B_2O_3$. This material produces a seal which can withstand thermal shock to at least about 475° C., i.e., the seal may be rapidly heated to 475° C. and cooled without loss of hermetic properties.

The second sealing material is a mixture having an average linear coefficient of thermal expansion (0°–300° C.) of about $84 \times 10^{-7}/°$ C. which consists essentially of about 6 parts zircon and 100 parts glass by weight, the glass consisting essentially, in parts by weight, of about 66 parts $SiO_2$, 12 parts BaO, 2.7 parts $Al_2O_3$, 2.0 parts $B_2O_3$, 6.7 parts $Na_2O$, 6.6 parts $K_2O$, 2.0 parts $ZrO_2$, 0.7 parts $Li_2O$ and 1.6 parts F. This material produces a seal which can resist thermal shock to at least about 425° C. Of course, minor amounts of other oxides may be present in either of these two sealing materials, provided thermal expansion, sealing behavior, and other important properties are not adversely affected thereby.

DESCRIPTION OF THE DRAWING

The invention may be further understood by reference to the FIGURE which consists of a partial schematic perspective view in cross-section of a hermetically-sealed lead-in structure incorporating a glass-metal compression seal according to the invention. The structure shown includes an outer member composed of steel which may form part of a case enclosing an electronic device (not shown). Positioned in an opening in the steel outer member is a glassy sealing member, composed of one of the two materials hereinabove described, which is hermetically sealed to the steel outer member. A metallic conductor composed of cobalt-nickel-iron alloy passes through the opening and through the glassy sealing member. This conductor is hermetically sealed to the glassy sealing member, such that an air-tight, moisture-proof barrier is formed by the sealed assembly.

DETAILED DESCRIPTION

Glasses to be used in providing the glassy sealing members of the invention may be produced in accordance with known practice. Glass batches may be compounded utilizing conventional glass batch materials which will yield the specified glass constituents at fusing temperatures, and the batches may then be melted in units such as pots, crucibles or the like to provide homogeneous molten glass. The molten glass may then be formed into sealing members having configurations approximating the configuration of the final seal.

Where the sealing material is to include a zircon component, or where several different preformed sealing member configurations are to be produced, the molten glass is desirably formed into a powder by dry-gauging or crushing, grinding, etc., and the powder then used to fabricate preformed sealing members by sintering or other methods. Where a zircon component is to be included in the composition, powdered zircon may be mixed with the powdered glass prior to the fabrication of the preformed seals.

To make a compression seal, the outer member, preformed glassy sealing member, and metallic conductor are placed in their approximate relative intended positions in the seal structure and the assembly is then heated above the softening point of the glass. After the glass has wet both the steel and metallic conductor and formed a hermetic seal therewith, the assembly is cooled to room temperature at a rate consistent with the mass of the glassy sealing member and any annealing requirements thereof. As the assembly is cooled, the steel outer member exerts compressive stress upon the glassy sealing member and metallic conductor due to the relatively high thermal contraction of the steel member during cooling. This stress maintains the mechanical integrity of the seal.

The invention may be further understood by reference to the following illustrative examples.

EXAMPLE I (PRIOR ART)

A preformed glass sealing member composed of a glass having an average linear coefficient of thermal expansion (0°–300° C.) of about $89 \times 10^{-7}/°$ C. and a composition consisting, in parts by weight, of about 65.77 parts $SiO_2$, 2.73 parts $Al_2O_3$, 2.00 parts $B_2O_3$, 6.68 parts $Na_2O$, 6.61 parts $K_2O$, 11.92 parts BaO, 2.00 parts $ZrO_2$, 0.68 parts $Li_2O$ and 1.6 parts F is provided. The sealing member is of annular configuration, having an outer diameter of about 0.062 inches, an inner diameter of about 0.022 inches, and a weight of about 8 milligrams.

The sealing member is fitted over a metallic conductor consisting of a KOVAR ® alloy pin and into a steel outer member consisting of a steel eyelet composed of SAE 1010 steel, which pin and eyelet are parts of a transistor header. The entire header assembly is then heated to about 1000° C. for about 15 minutes to seal the glass to the pin and eyelet, and is then cooled and inspected. Inspection of the assembly after sealing indicates that the sealing member has formed a strong hermetic seal between the eyelet and pin.

The sealed assembly is then subjected to a thermal shock test wherein it is heated to a temperature of 425° C. within an interval of a few seconds, held at 425° C. for at least a minute, and then cooled. The assembly is then reinspected and it is found that the hermetic seal has been broken by thermal shock.

EXAMPLE II

A preformed glass sealing member composed of a glass having an average linear coefficient of thermal expansion (0°–300° C.) of about $88.5 \times 10^{-7}/°$ C. and a composition consisting, in parts by weight, of about 63.24 parts $SiO_2$, 2.65 parts $Al_2O_3$, 14.05 parts SrO, 5.85 parts $Na_2O$, 8.93 parts $K_2O$, 3.04 parts $B_2O_3$, 0.40 parts $Sb_2O_3$, 0.81 parts $TiO_2$, 0.66 parts $CeO_2$ and 0.39 parts BaO is provided. This sealing member, which has a configuration identical to that of the sealing member described in Example I, is positioned in a transistor header assembly comprising a steel eyelet and KOVAR ® alloy pin as in Example I, and the assembly heated to 1000° C. for 15 minutes to seal the glass to the stainless steel eyelet and alloy pin.

Inspection of the header assembly after sealing indicates that the sealing member has formed a strong hermetic seal between the eyelet and pin. This hermetic seal is not broken when the assembly is subjected to a thermal shock test comprising rapid heating to 425° C. as in Example I. Further thermal shock testing of seals of this configuration indicates that such seals can withstand thermal shock to 475° C. without loss of hermetic properties.

EXAMPLE III

A preformed glassy sealing member composed of a mixture having an average linear coefficient of thermal expansion (0°–300° C.) of about $84 \times 10^{-7}/°$ C. and a composition consisting of 6 parts zircon and 100 parts glass by weight, the glass consisting of 65.77 parts $SiO_2$, 11.92 parts BaO, 2.73 parts $Al_2O_3$, 2.00 parts $B_2O_3$, 6.68 parts $Na_2O$, 6.61 $K_2O$, 2.00 parts $ZrO_2$, 0.68 parts $Li_2O$ and 1.6 parts F by weight, is provided. This sealing member, which has a configuration identical to that of the sealing member described in Example I, is positioned in a transistor header assembly comprising a steel eyelet and KOVAR ® alloy pin as in Example I, and the assembly is then heated to 1000° C. for 15 minutes to seal the glassy member to the steel eyelet and the alloy pin.

Inspection of the header assembly after sealing indicates that the sealing member has formed a strong hermetic seal between the eyelet and pin. This hermetic seal is not broken when the assembly is subjected to thermal shock testing 425° C. as in Example I, indicating that assemblies of the configuration described can withstand thermal shock to at least about 425° C. without loss of seal.

I claim:

1. In a hermetically sealed lead-in structure for an electronic device comprising a glass-metal compression seal which includes a steel outer member having an opening therethrough, a unitary glassy sealing member positioned in the opening in the steel outer member and hermetically sealed to the steel, and a metallic conductor passing through the glassy sealing member and hermetically sealed thereto, wherein the steel outer member is composed of a steel having an average linear coefficient of thermal expansion (30°–300° C.) in the range of about 120–130 × $10^{-7}$/° C. and the metallic conductor is composed of cobalt-nickel-iron alloy having an average linear coefficient of thermal expansion (30°–400° C.) of about 46–52 × $10^{-7}$/° C., the improvement wherein the glassy sealing member is composed of a material selected from the group consisting of:
  (a) a glass having an average linear coefficient of thermal expansion (0°–300° C.) of about 88.5 × $10^{-7}$/° C. and a composition consisting essentially, in parts by weight, of about 63 parts $SiO_2$, 2.6 parts $Al_2O_3$, 14 parts SrO, 5.8 parts $Na_2O$, 8.9 parts $K_2O$ and 3.0 parts $B_2O_3$, and
  (b) a mixture having an average linear coefficient of thermal expansion (0°–300° C.) of about 84 × $10^{-7}$/° C. and a composition consisting essentially of 6 parts zircon and 100 parts glass by weight, the glass consisting essentially, in parts by weight, of about 66 parts $SiO_2$, 12 parts BaO, 2.7 parts $Al_2O_3$, 2.0 parts $B_2O_3$, 6.7 parts $Na_2O$, 6.6 parts $K_2O$, 2.0 parts $ZrO_2$, 0.7 parts $Li_2O$ and 1.6 parts F.

2. A hermetically sealed lead-in structure in accordance with claim 1 wherein the glassy sealing member consists, in parts by weight, of about 63.24 parts $SiO_2$, 2.65 parts $Al_2O_3$, 14.05 parts SrO, 5.85 parts $Na_2O$, 8.93 parts $K_2O$, 3.04 parts $B_2O_3$, 0.40 parts $Sb_2O_3$, 0.81 parts $TiO_2$, 0.66 parts $CeO_2$ and 0.39 parts BaO, and wherein the lead-in structure can withstand thermal shock to 475° C. without loss of hermetic seal.

3. A hermetically sealed lead-in structure in accordance with claim 1 wherein the glassy sealing member consists of about 6 parts zircon and 100 parts glass by weight, the glass consisting of 65.77 parts $SiO_2$, 11.92 parts BaO, 2.73 parts $Al_2O_3$, 2.00 parts $B_2O_3$, 6.68 parts $Na_2O$, 6.61 parts $K_2O$, 2.00 parts $ZrO_2$, 0.68 parts $Li_2O$ and 1.6 parts F by weight, and wherein the lead-in structure can withstand thermal shock to 425° C. without loss of hermetic seal.

* * * * *